(12) United States Patent
Kim et al.

(10) Patent No.: US 7,517,762 B2
(45) Date of Patent: Apr. 14, 2009

(54) SEMICONDUCTOR DEVICE CAPABLE OF PREVENTING MOISTURE-ABSORPTION OF FUSE AREA THEREOF AND METHOD FOR MANUFACTURING THE FUSE AREA

(75) Inventors: Byung-yoon Kim, Yongin (KR); Won-seong Lee, Kaepo (KR); Young-woo Park, Kunpo (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 402 days.

(21) Appl. No.: 11/139,906

(22) Filed: May 26, 2005

(65) Prior Publication Data

US 2005/0221539 A1 Oct. 6, 2005

Related U.S. Application Data

(62) Division of application No. 10/334,745, filed on Dec. 31, 2002, now Pat. No. 6,913,953, which is a division of application No. 09/550,967, filed on Aug. 29, 2000, now Pat. No. 6,525,398.

(30) Foreign Application Priority Data

Aug. 31, 1999 (KR) .................................. 99-36534

(51) Int. Cl.
H01L 23/62 (2006.01)
H01L 21/8242 (2006.01)

(52) U.S. Cl. ...................... 438/281; 438/132; 438/140; 438/200; 438/201; 438/210; 438/215; 438/239; 438/241; 438/333; 438/467; 438/601; 438/FOR. 189; 438/FOR. 206; 438/FOR. 212; 438/FOR. 230; 257/68; 257/71; 257/127; 257/170; 257/209; 257/409; 257/452; 257/484; 257/529; 257/530; 257/605; 257/906; 257/907; 257/908; 257/E21.646; 257/E23.149; 257/E27.084; 257/E29.012; 257/E29.013

(58) Field of Classification Search ............... 438/132, 438/140, 200, 201, 210, 215, 239, 241, 281, 438/333, 467, 601, FOR. 189, FOR. 208, 438/FOR. 212, FOR. 230; 257/68, 71, 127, 257/170, 209, 409, 452, 484, 529, 530, 605, 257/906–908, E21.646, E23.149, E27.084, 257/E29.012, E29.013

See application file for complete search history.

(56) References Cited

U.S. PATENT DOCUMENTS 5,202,275 A * 4/1993 Sugiura et al. .............. 438/210

(Continued)

FOREIGN PATENT DOCUMENTS

JP 9-69571 3/1997

(Continued)

OTHER PUBLICATIONS

English language abstract of Japanese Publication No. 9-69571.

(Continued)

*Primary Examiner*—Zandra Smith
*Assistant Examiner*—Maliheh Malek
(74) *Attorney, Agent, or Firm*—Marger Johnson & McCollom, P.C.

(57) ABSTRACT

A fuse area of a semiconductor device capable of preventing moisture-absorption and a method for manufacturing the fuse area are provided. When forming a guard ring for preventing permeation of moisture through the sidewall of an exposed fuse opening portion, an etch stop layer is formed over a fuse line. A guard ring opening portion is formed using the etch stop layer. The guard ring opening portion is filled with a material for forming the uppermost wiring of multi-level interconnect wirings or the material of a passivation layer, thereby forming the guard ring concurrently with the uppermost interconnect wiring or the passivation layer. Accordingly, permeation of moisture through an interlayer insulating layer or the interface between interlayer insulating layers around the fuse opening portion can be efficiently prevented by a simple process. In addition, the etch stop layer is also formed under the fuse opening portion so that an insulating layer remaining on the fuse line can be controlled to have a predetermined thickness when forming the fuse opening portion, thereby improving the cutting efficiency of fuses.

24 Claims, 15 Drawing Sheets

U.S. PATENT DOCUMENTS

| | | | | |
|---|---|---|---|---|
| 5,444,012 | A | * | 8/1995 | Yoshizumi et al. ............ 438/6 |
| 5,538,924 | A | * | 7/1996 | Chen ........................ 438/132 |
| 5,652,459 | A | | 7/1997 | Chen |
| 5,712,206 | A | * | 1/1998 | Chen ........................ 438/601 |
| 5,970,346 | A | * | 10/1999 | Liaw ........................ 438/281 |
| 5,994,762 | A | * | 11/1999 | Suwanai et al. ............ 257/620 |
| 6,008,075 | A | * | 12/1999 | Lien et al. .................. 438/132 |
| 6,121,073 | A | | 9/2000 | Huang et al. |
| 6,294,474 | B1 | | 9/2001 | Tzeng et al. |
| 6,399,472 | B1 | * | 6/2002 | Suzuki et al. ............... 438/601 |

FOREIGN PATENT DOCUMENTS

| | | | |
|---|---|---|---|
| JP | 09-069571 | * | 11/1997 |
| JP | 10-308459 | | 11/1998 |

OTHER PUBLICATIONS

English language abstract of Japanese Publication No. 10-308459.

* cited by examiner

SEMICONDUCTOR DEVICE CAPABLE OF PREVENTING MOISTURE-ABSORPTION OF FUSE AREA THEREOF AND METHOD FOR MANUFACTURING THE FUSE AREA

This application is a Divisional of U.S. Ser. No. 10/334,745, filed on Dec. 31, 2002, now issued U.S. Pat. No. 6,913,953, which is a divisional of U.S. patent application Ser. No. 09/650,967, filed on Aug. 29, 2000, now issued U.S. Pat. No. 6,525,398, which claims priority from Korean Patent Application No. 1999-36534, filed on Aug. 31, 1999, all of which are hereby incorporated by reference in their entirety.

BACKGROUND OF THE INVENTION

1. Field of the Invention

The present invention relates to a semiconductor device and a method for manufacturing the same, and more particularly, to the structure of a fuse area and a method for forming the fuse area.

2. Description of the Related Art

Generally, semiconductor devices are formed by stacking material layers of various patterns and finally depositing a protection film called a passivation film. The passivation film, conventionally formed of a hard film such as a silicon nitride film, protects semiconductor devices, especially by absorbing mechanical, electrical and chemical shocks during a subsequent assembly or packaging process.

Normally, a repair process is performed on semiconductor devices such as memory devices when their circuits do not properly operate due to defects that occur during manufacturing. The defective circuits may be replaced with redundant circuits, or a trimming process may be performed in which the characteristics of some circuits are modified for a given application. The repair or trimming process is performed by methods such as cutting (severing) certain wirings using irradiation of a laser beam. The wirings, portions of which are to be severed by the irradiation of a laser beam, are referred to as fuse lines, and an area including the severed portions (wiring) and a region surrounding the severed portions is referred to as a fuse area.

FIG. 1 is a sectional view of a conventional semiconductor device, particularly, a sectional view for showing a portion of a memory cell and a fuse area in a dynamic random access memory (DRAM) device employing a multi-level interconnect wiring structure. A cell array area is shown on the left side of FIG. 1. The cell array area includes a memory cell composed of a transistor (14, 16 and 18) and a capacitor (30, 32 and 34), multi-level interconnect wirings 38 and 42, interlayer insulating films 20, 26, 36 and 40 and a passivation film 44. A fuse area is shown on the right side of FIG. 1. The fuse area includes a fuse line, that is, a bit line 24 connected to the drain region 16 of the transistor via a bit line contact. The fuse area further includes a fuse opening portion A formed by etching a predetermined depth and width of the interlayer insulating films 36 and 40 and the passivation film 44 on the fuse line 24. The fuse opening portion A is irradiated with a laser beam, thereby cutting the underlying fuse line 24 (This laser cutting step not shown in FIG. 1).

For simplicity, each of the interlayer insulating films 20, 26, 36 and 40 is illustrated as a single film but can be formed of a multi-layer film. In addition, a lower electrode contact 28 is provided for electrically connecting the source region 18 of the transistor with the lower electrode 30 of the capacitor. The capacitor is placed on a plane different from that of the bit line 24 and thus does not contact the bit line 24. Here, the bit line 24 is described as a fuse line, but the fuse line is not limited to the bit line and may be a word line 14 or another wiring. These features are also included in the embodiments of the present invention to be described herein.

The fuse area of a conventional semiconductor device having a structure as shown in FIG. 1 has various problems. Particularly, each of the interlayer insulating films 26, 36 and 40, which are exposed by the fuse opening portion A, is usually formed of an insulating material of the silicon oxide family. For example, a borophosphosilicate glass (BPSG) film, a phosphorous silicate glass (PSG) film, a spin on glass (SOG) film, a tetra ethyl orthosilicate (TEOS) film and an undoped silicate glass (USG) film which exhibits excellent step coverage are used for the interlayer insulating films 26, 36 and 40 to alleviate a large step-difference problem in the cell array area. However, films containing a large amount of impurity, such as the above described BPSG film, PSG film, SOG film and TEOS film, in which boron (B) exceeds 5 weight percent and phosphorous (P) exceeds 4 weight percent, cannot withstand much moisture. Moisture may permeate the device through such films. As a result, metal interconnects, for example, the interconnect wirings 38 and 42 formed of aluminum, corrode, thereby degrading the reliability of semiconductor devices.

Referring now to FIG. 2, to solve this problem, Japanese Patent Publication No. Hei 9-69571 suggests forming a guard ring 38' and 42' in a quadrilateral shape surrounding a fuse opening portion A as shown in FIG. 2. The guard ring 38' and 42' is a two-layer structure, which may be formed of the same material as multi-level interconnect wirings 38 and 42, e.g., aluminum, and may be simultaneously formed with the multi-level interconnect wirings 38 and 42, respectively. In addition, an etch stop layer 34' having a quadrilateral border shape is formed under the guard ring 38' to stop etching of an interlayer insulating film 36 during etching for forming a guard ring opening portion. The etch stop layer 34' may be formed of the same material as an upper electrode 34 of a capacitor, e.g., polysilicon, and may be simultaneously formed with the upper electrode 34.

Accordingly, the guard rings 38' and 42' block moisture permeating through the interlayer insulating films 36 and 40, which comprise the side wall of the fuse opening portion A, thereby improving the device reliability. However, moisture may permeate the device through an interlayer insulating layer 26 where a guard ring is not formed. Particularly, because the guard rings 38' and 42' are formed as a multi-layer structure, moisture may permeate through the interfaces among the interlayer insulating films 26, 36 and 40 which are vulnerable to moisture coming through the interface between the layers of the guard rings 38' and 42'. Moreover, a layout area increases due to the additional formation of guard rings 38' and 42', thereby decreasing the high integration density of semiconductor devices.

SUMMARY OF THE INVENTION

To solve the above problems, it is a first object of the present invention to provide a semiconductor device having a fuse area better protected at preventing moisture-permeation and allowing for efficient cutting of fuses.

It is a second object of the present invention to provide a method for forming a fuse area of a semiconductor device, which is better at preventing moisture-absorption and allows for efficient cutting of fuses.

Accordingly, to achieve the first object, the present invention provides a semiconductor device having a multi-level interconnect wiring structure and a fuse opening portion which allows cutting of a fuse line. The semiconductor device includes a guard ring having a quadrilateral border shape surrounding the fuse opening portion, for blocking permeation of moisture through the fuse opening portion; an etch stop layer formed over the fuse line and at least under the guard ring; a multi-layer interlayer insulating layer structure formed on the entire surface of a substrate including the etch stop layer, the multi-layer interlayer insulating layer structure containing the guard ring, wherein the fuse opening portion is formed in the multi-layer interlayer insulating layer structure; and a passivation layer formed on the entire surface of the substrate including the guard ring and the multi-layer interlayer insulating layer structure and is etched to expose the fuse opening portion. The guard ring vertically extends from the etch stop layer to the uppermost wiring of the multi-layer interconnect wirings.

The guard ring is formed of a material for forming the uppermost wiring of the multi-level interconnect wirings or the passivation layer.

The semiconductor device also includes a moisture barrier layer over or under the etch stop layer.

To achieve the second object, the present invention provides a method for forming a fuse area of a semiconductor device. Primarily, an etch stop layer is formed over the fuse line and at least in a region in which the guard ring is formed. A multi-layer interlayer insulating layer structure is formed on a substrate including the etch stop layer. The multi-layer interlayer insulating layer structure is etched until part of the etch stop layer is exposed so as to form a guard ring opening portion. The guard ring is formed by filling the guard ring opening portion with a predetermined material. The guard ring opening portion vertically extends from the etch stop layer to the uppermost wiring of the multi-level interconnect wirings.

The guard ring is formed of a material for forming an uppermost wiring or the material of a passivation layer and formed simultaneously with the uppermost wiring or the passivation layer.

The method also includes the step of forming a moisture barrier layer at least under the regions in which the guard ring and the fuse opening portion are formed, before or after the step of forming the etch stop layer.

The etch stop layer may be separately formed in a region in which the guard ring opening portion is formed and in a region in which the fuse opening portion is formed so that the etch stop layer can be used as an etch stop layer when forming the guard ring opening portion and when forming the fuse opening portion.

According to the present invention, the guard ring is formed at one time using the passivation layer or the uppermost wiring, thereby efficiently preventing permeation of moisture through the interface between the interlayer insulating films.

In addition, when the guard ring is simultaneously formed with the uppermost interconnect wiring, the passivation layer is etched to expose the part of the guard ring when forming the fuse opening portion, thereby minimizing an increase in a layout area due to formation of the guard ring.

Moreover, according to an embodiment of the present invention, the etch stop layer is used when an etching process is performed for forming the fuse opening portion so that the thickness of an interlayer insulating film remaining on the fuse line can be accurately controlled as compared with a conventional method of forming a fuse opening portion using timed etching, thereby improving the cutting efficiency of a fuse.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

Figure 3:
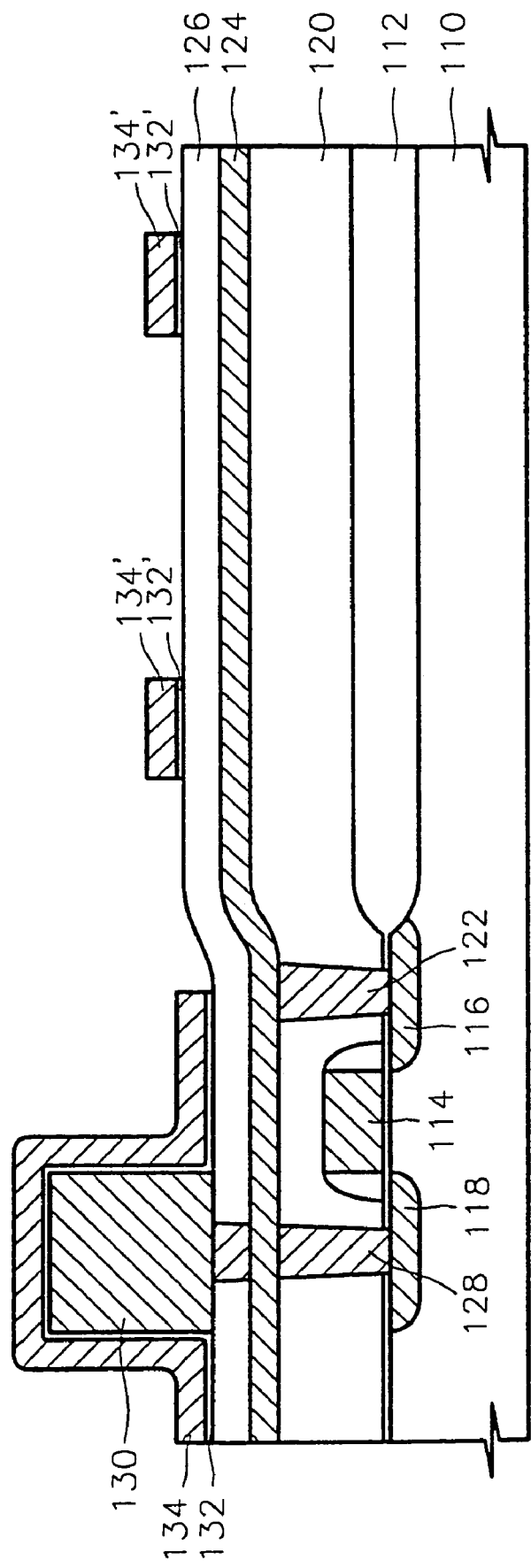
FIGS. 3 through 7 are sectional views of a semiconductor device for showing process steps for forming a fuse area according to an embodiment of the present invention.

A portion of a DRAM device is illustrated in FIGS. 3 through 7. FIG. 3 shows a capacitor (130, 132, and 134). A fuse area in this embodiment is concurrently formed with a cell array area. Using conventional techniques, a device isolation film 112 is formed on a substrate 110. Then, a gate electrode 114 and source and drain regions 118 and 116 of a transistor are formed. An interlayer insulating film 120 is deposited on the entire surface of the substrate 110 including the device isolation film 112. Subsequently, the interlayer insulating film 120 is etched to form a contact hole exposing the drain region 116. Next, a conductive material, for example, doped polysilicon, metal silicide or a stacked film of polysilicon and metal silicide, is processed conventionally to form a contact plug 122 in the contact hole and a bit line 124 extending across the region of the device. The bit line 124 on the right of FIG. 3 functions as a fuse line. As described above, instead of the bit line 124, a word line 114 may be functioning as the fuse line. The height of the fuse line in the fuse area may be appropriately adjusted so as to improve the cutting (severing) efficiency.

An interlayer insulating film 126 is deposited on the entire surface of the bit line (the fuse line) 124 and then etched to form a contact hole exposing the source region 118. A conductive material, for example, doped polysilicon, is deposited in the contact hole to form a contact plug 128, and then a lower electrode 130 of a capacitor is formed on the contact plug 128. In the drawing, the lower electrode 130 is formed in simple stack shape, but may be formed in a different shape such as a cylindrical shape or a fin shape. Hemispherical grains may also be formed on the surface of the lower electrode 130. Next, a dielectric film 132 is formed on the entire surface of the lower electrode 130, and an upper electrode layer, formed of a conductive material, for example, doped polysilicon, is deposited on the dielectric film 132.

Thereafter, the upper electrode layer is patterned to form an upper electrode 134 as shown in FIG. 3. The upper electrode layer in the fuse area on the right side of the drawing is patterned in the shape of a quadrilateral border surrounding a region to be irradiated with a laser beam, that is, a region in which a fuse opening portion is formed. An upper electrode layer pattern 134', which is patterned in the shape of a quadrilateral border in the fuse area, functions as an etch stop layer during etching of interlayer insulating films for forming a guard ring opening portion.

Figure 4:
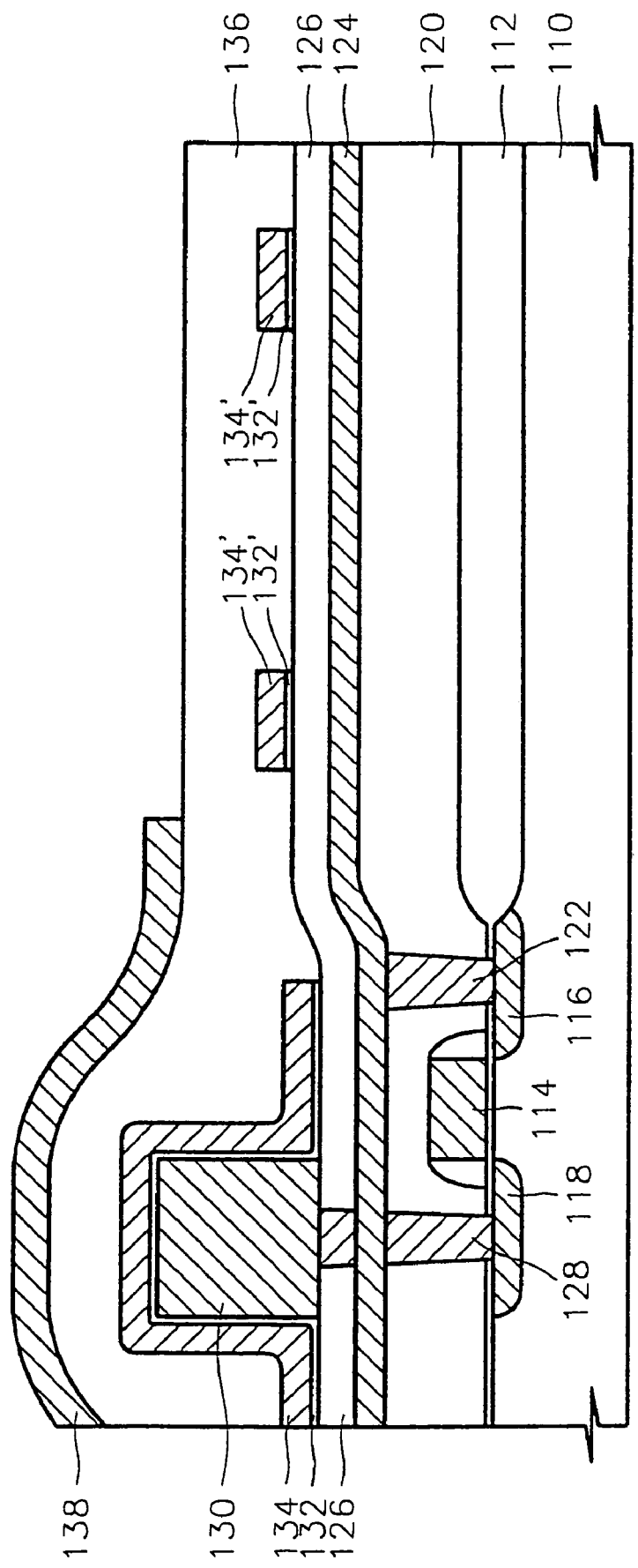

Subsequently, as shown in FIG. 4, a silicon oxide film having excellent step coverage is deposited on the resultant structure to form an interlayer insulating film 136, and then a lower interconnect wiring 138 is formed.

Figure 5:
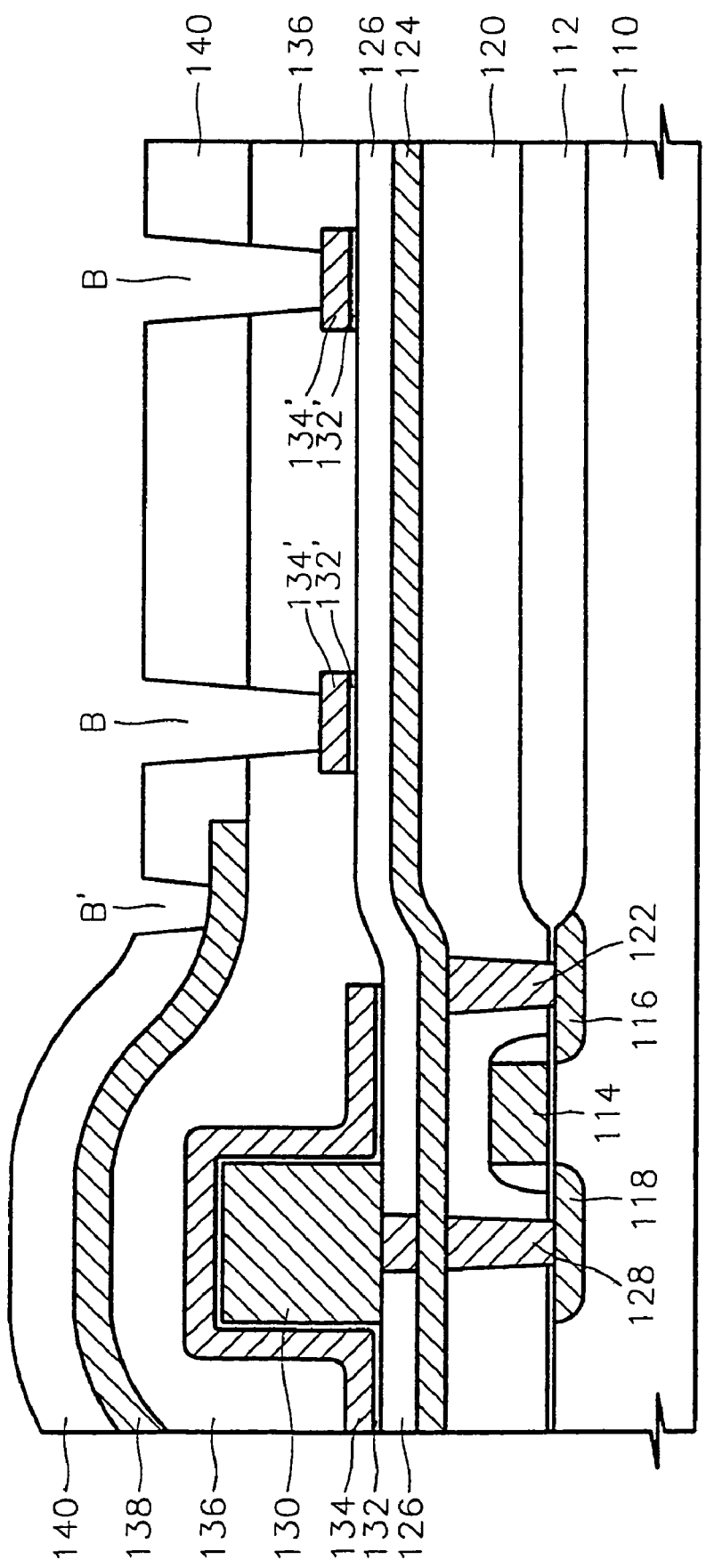

Next, as shown in FIG. 5, an interlayer insulating film 140 is deposited on the entire surface of the substrate and is then etched to form a guard ring opening portion B in a region where a guard ring is to be formed. In other words, the interlayer insulating films 140 and 136 are sequentially etched to expose the etch stop layer 134' which is formed in the fuse area in the shape of a quadrilateral border. During the etching process for forming the guard ring opening portion B, a via B' for the connection between interconnect wirings may be simultaneously formed. Even though the depths of the guard ring opening portion B and the via B' are different in FIG. 5, they can be simultaneously formed by performing etching until the etch stop layer 134' and the lower interconnect wiring 138 are respectively exposed. The embodiment shown in FIG. 5 is described using a double-level interconnect system. However, if triple-level (or more) interconnect systems are used, the guard ring opening portion B can be formed immediately before the last wiring is deposited.

Figure 1:
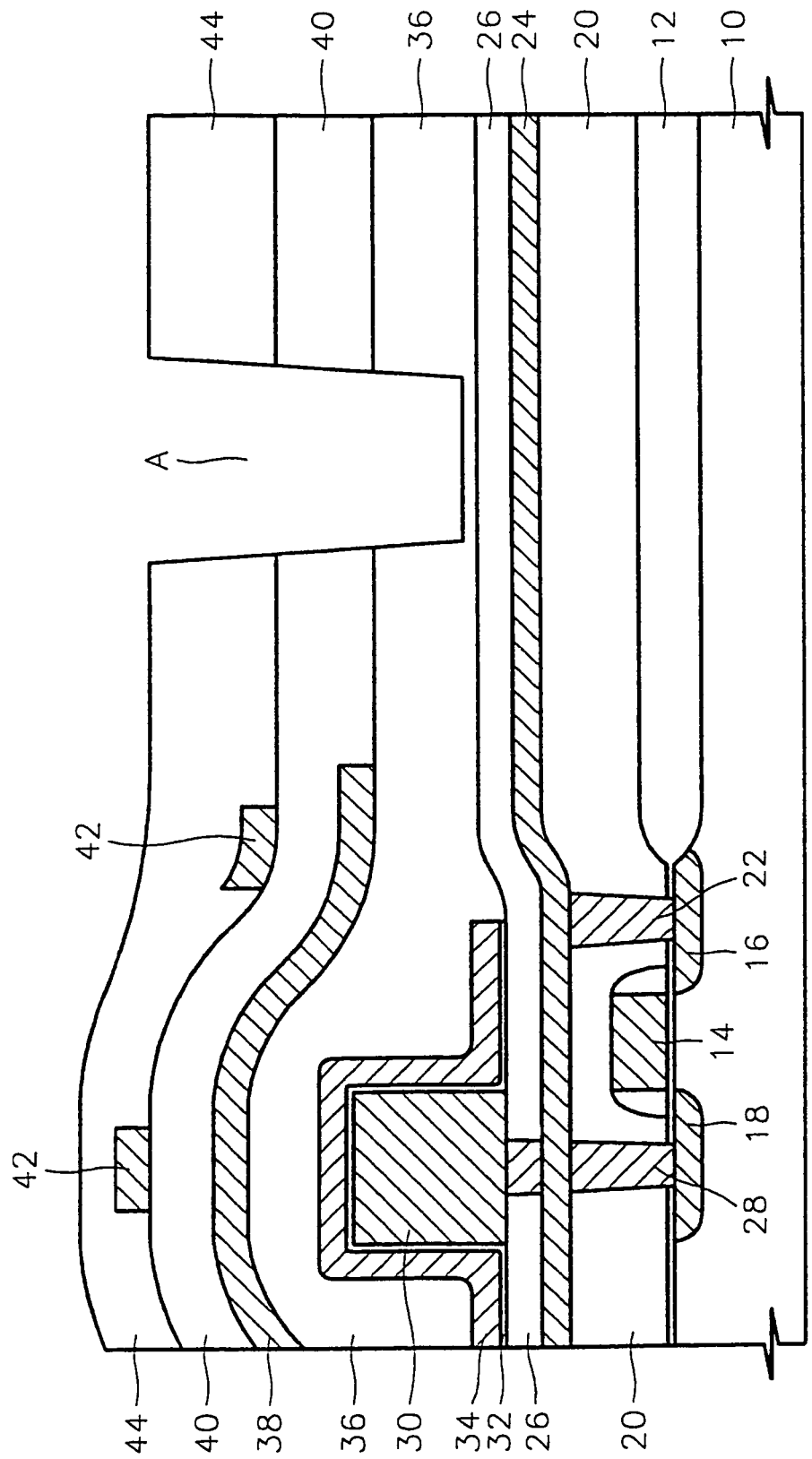
FIG. 1 is a sectional view of part of a conventional semiconductor device including a fuse area.
Figure 2:
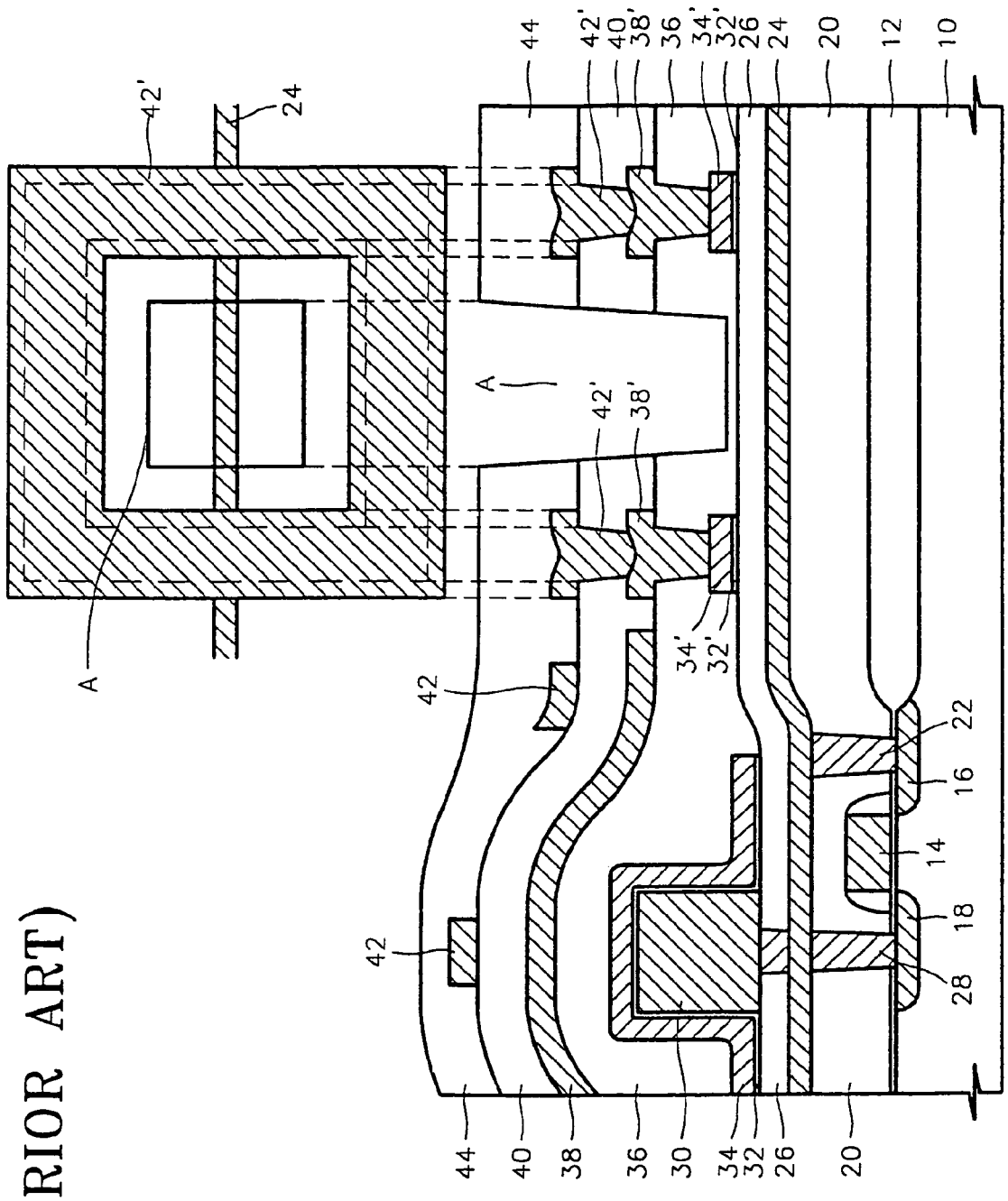
FIG. 2 is a sectional view of part of a conventional semiconductor device having a guard ring about a fuse area and a plan view of the fuse area.
Figure 6:
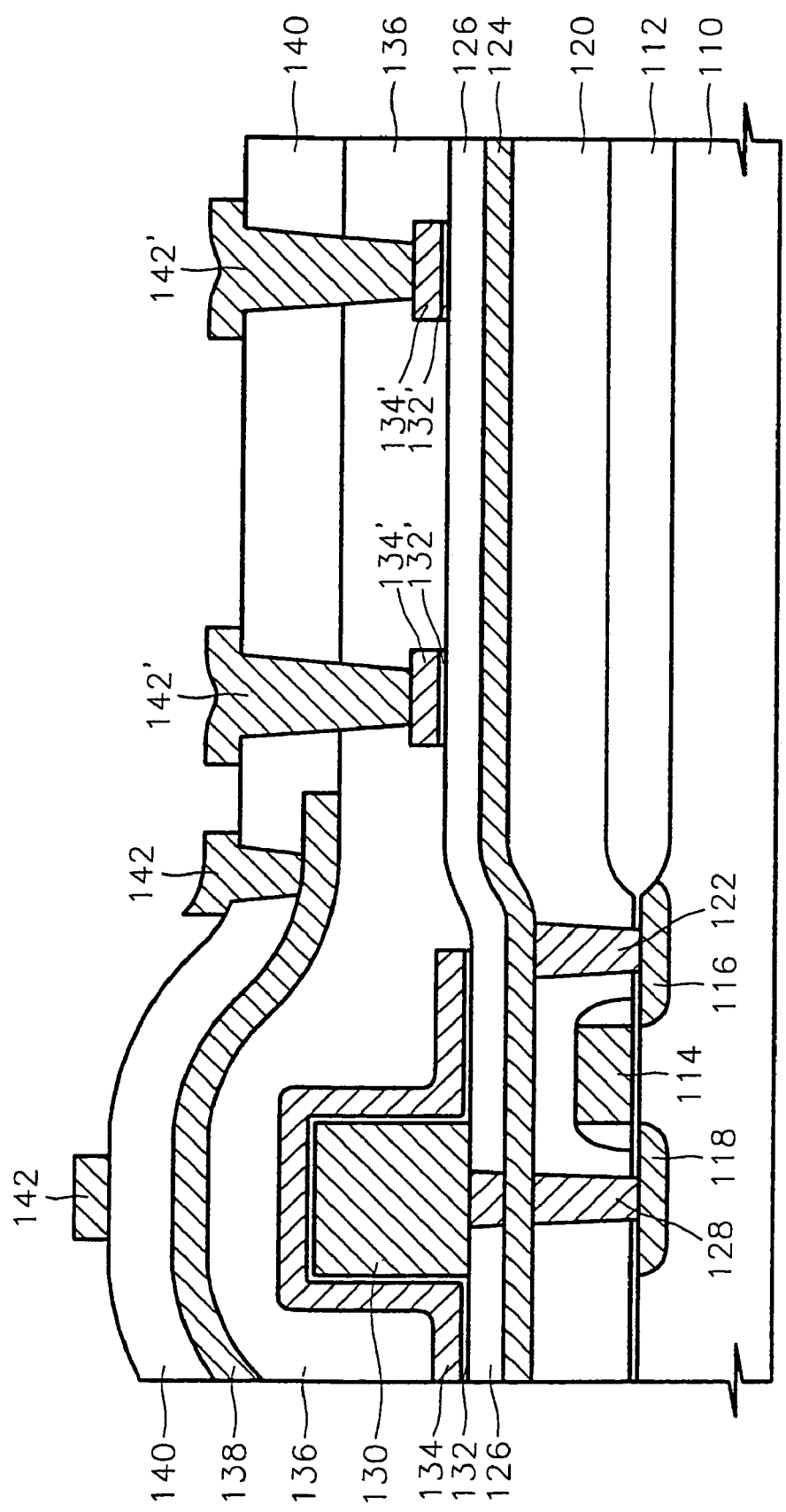

Subsequently, as shown in FIG. 6, an uppermost wiring metal is deposited on the entire surface of a resultant structure including the guard ring opening portion B and then patterned to concurrently form an uppermost interconnect wiring 142 and a guard ring 142'. As seen from FIG. 6, the guard ring 142' of the present invention is completed at one time, i.e., using a single deposition and patterning process, so overlay margins need to be considered only two times for alignment of upper and lower layers. However, when forming the guard ring 38' and 42' according to the conventional method as shown in FIG. 2, overlay margins must be considered four times. While the number of overlay margins to be considered increases in the conventional method as the number of interconnect wiring levels increases, in the present invention, overlay margins need to considered only two times regardless of the number of interconnect wiring levels.

Figure 7:
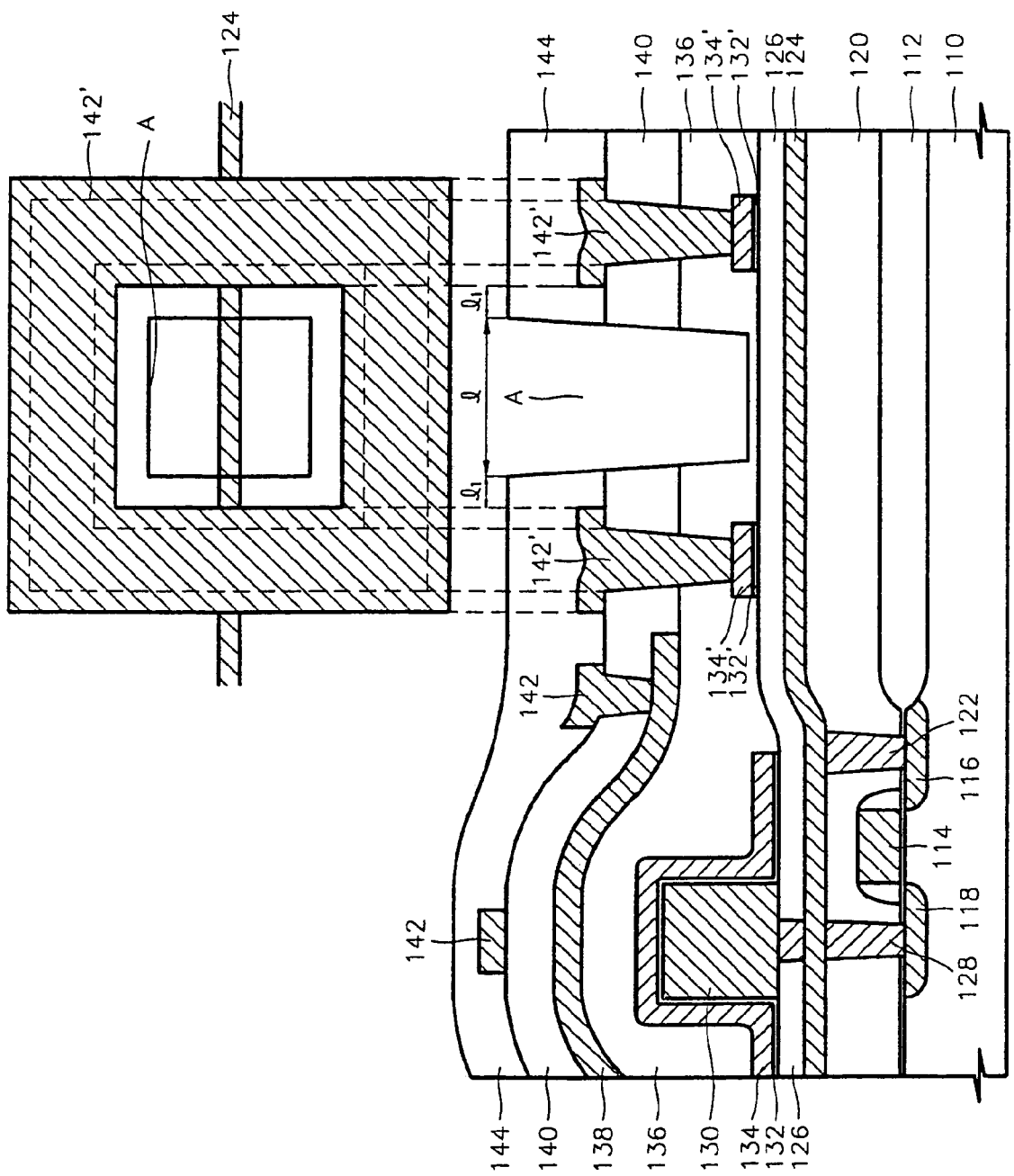

Next, as shown in FIG. 7, a passivation layer 144 comprised of a material such as silicon nitride is formed on the entire surface of a resultant structure. The passivation layer 144 and interlayer insulating films 140 and 136 in a region to be irradiated with a laser beam are etched to form a fuse opening portion A. Cutting efficiency of the fuse line 124 is good when the thickness of an insulating film remaining on the fuse line 124 in the fuse opening portion A is about 3000 Å.

Thus, the fuse opening portion A and the guard ring 142' are formed having a planar layout as shown in plan view in the upper right side of FIG. 7. A single fuse line 124 passes a single fuse opening portion A in the fuse area and a single fuse opening portion A is included in a single guard ring 142' in FIG. 7. A plurality of fuse opening portions A, however, may be embraced by a single guard ring 142'. Furthermore, a plurality of fuse lines 124 may pass through a single fuse opening portion A.

The embodiment described above can be modified in various ways as illustrated in FIGS. 8A through 8H. For simplicity, only the region of the fuse is shown in FIGS. 8A through 8H.

Figure 8A:
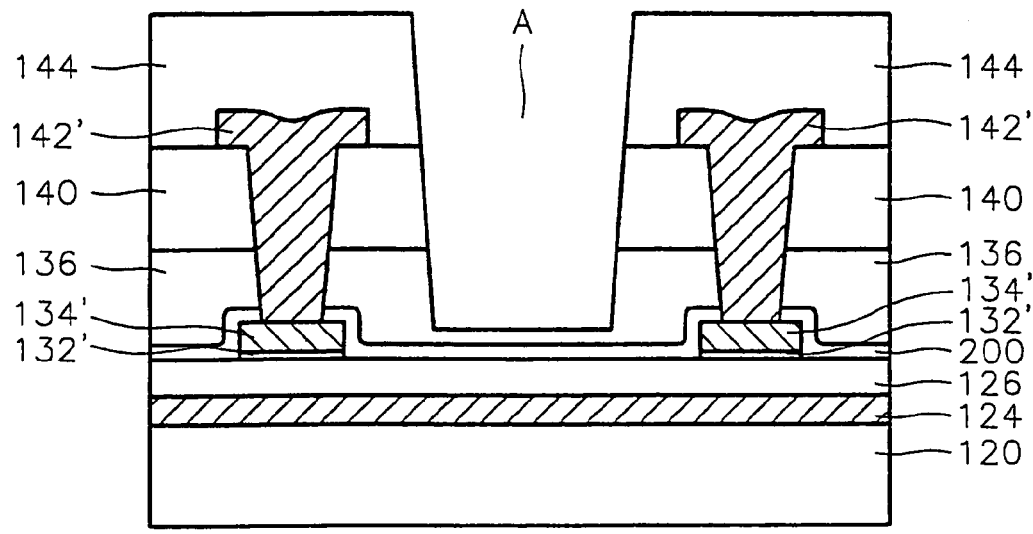
FIGS. 8A through 10 are sectional views of a semiconductor device for showing fuse areas formed according to various modifications to the preferred embodiment of the present invention.

In forming the fuse area as shown in FIG. 8A, a moisture barrier layer 200 is formed on the entire surface of the resultant structure as shown in FIG. 3 to a thickness of more than several tens of angstroms. The moisture barrier layer 200 is formed of a material that is substantially impervious to moisture, for example, an undoped silicate glass (USG) film, a silicon oxide film containing a low density of impurities, a silicon nitride film or a multi-layer structure comprising a silicon oxide film and a silicon nitride film. In the embodiments described below, a moisture barrier layer is formed of one of the above described materials. Next, the processes described in FIGS. 4 through 7 are performed over the moisture barrier layer. When the interlayer insulating films 140 and 136 are etched to form the guard ring opening portion B as shown in FIG. 5, the moisture barrier layer 200 is exposed prior to the etch stop layer 134'. However, the thickness of the moisture barrier layer 200 is thin enough so that it does not function as an etch stop layer. Accordingly, etching stops at the underlying etch stop layer 134'.

Figure 8B:
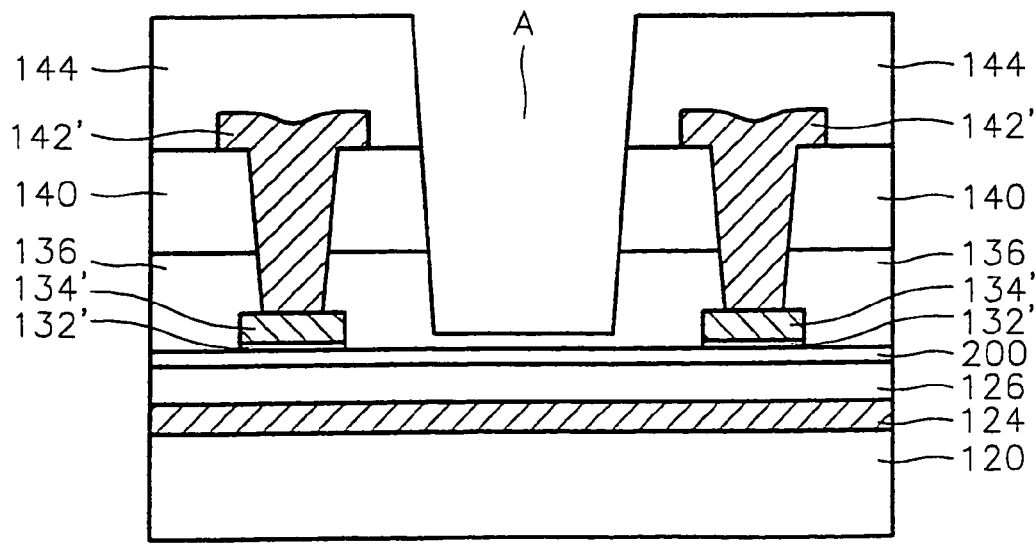

In forming the fuse area shown in FIG. 8B, the moisture barrier layer 200 is formed under the etch stop layer 134'. The moisture barrier layer 200 under the etch stop layer 134' is formed before forming the capacitor 130, 132 and 134 and the lower electrode contact plug 128 of FIG. 3. In other words, after forming the interlayer insulating film 126, the moisture barrier layer 200 is deposited on the interlayer insulating film 126 to a thickness of more than several tens of angstroms. Thereafter, the process steps shown in FIGS. 3 through 7 are performed thereon.

Figure 8C:
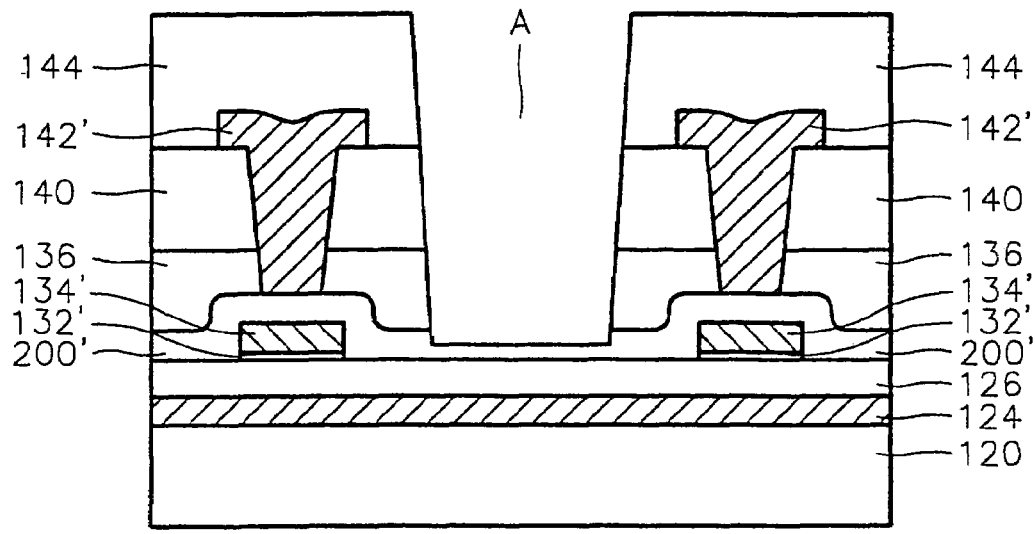

The fuse area shown in FIG. 8C includes a moisture barrier layer 200' in a similar manner to that of FIG. 8A, but the thickness of the moisture barrier layer 200' is greater than 5000 Å, which is much thicker than the thickness of the moisture absorption preventing layer 200 of FIG. 8A. The moisture barrier layer 200' is formed thick enough for it to function as an etch stop layer during the formation of the guard ring opening portion B shown in FIG. 5. The thick moisture barrier layer 200' can also be used as an etch stop layer when forming the fuse opening portion A. In other words, the passivation layer 144 and the interlayer insulating films 140 and 136 are sequentially etched until the moisture barrier layer 200' is exposed. When the moisture barrier layer 200' is exposed, the moisture barrier layer 200' is etched to a predetermined thickness, (e.g., until the sum of the thicknesses of the interlayer insulating film 126 and the moisture barrier layer 200', which remain on the fuse line 124, is about 3000 Å), thereby forming the fuse opening portion A.

Figure 8D:
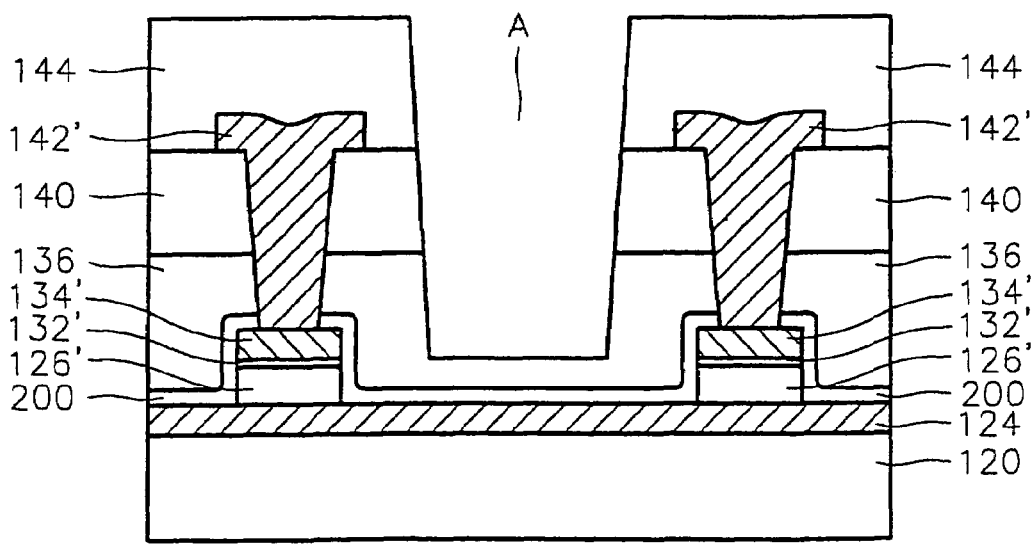

In forming the fuse area of FIG. 8D, the interlayer insulating film 126 under the etch stop layer 134' shown in FIG. 3 is continuously etched to form an interlayer insulating film pattern 126'. The moisture barrier layer 200 is formed overlying the resulting structure including the etch stop layer 134' and the fuse line 124. Then the processes of FIGS. 4 through 7 are performed thereon.

Figure 8E:
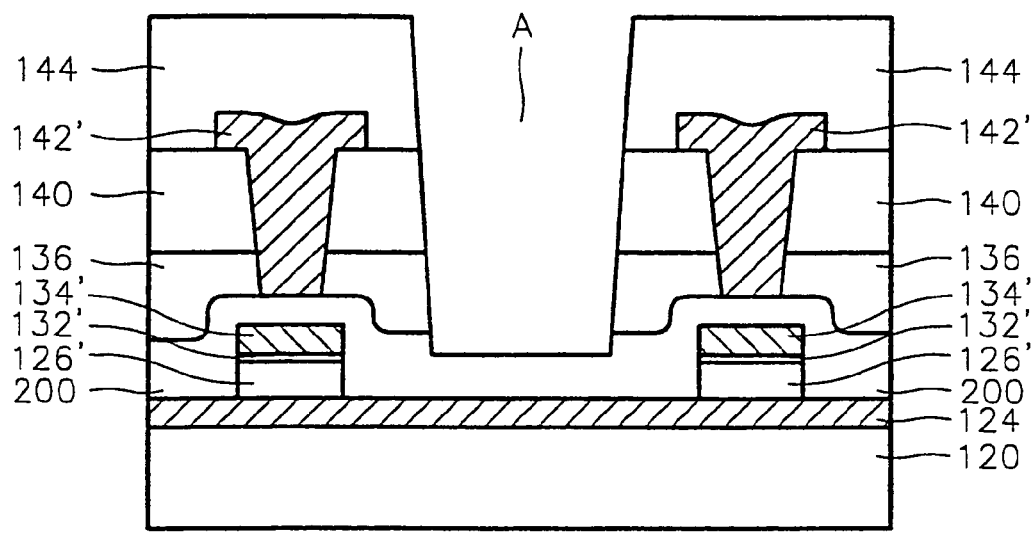

The fuse area shown in FIG. 8E includes the interlayer insulating film 126' in the same manner as the fuse area shown in FIG. 8D, and includes the thick moisture barrier layer 200' in a similar manner to that of FIG. 8C.

Figure 8F:
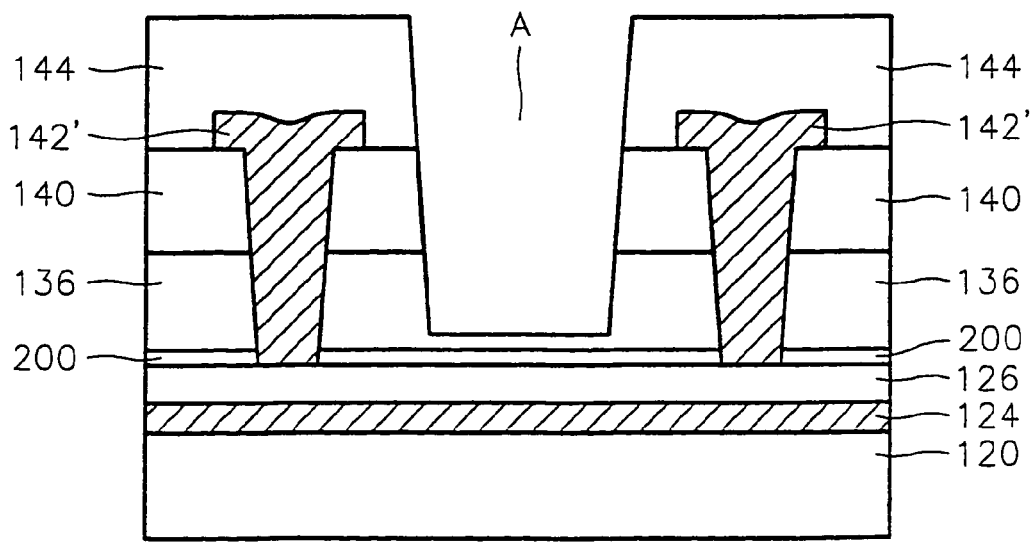

Unlike the above modified examples and embodiment, the fuse area of FIG. 8F does not include an etch stop layer 134'. In other words, during the process step shown in FIG. 3, the upper electrode layer formed on the fuse area is removed to expose the interlayer insulating film 126. The moisture barrier layer 200 is formed on the exposed interlayer insulating film 126 (moisture barrier layer 200 may be formed before forming the capacitor 130, 132 and 134 and the lower electrode contact plug 128 of FIG. 3). Then, the process steps shown in FIGS. 4 through 7 are performed thereon. In this case, when etching the interlayer insulating films 140 and 136 to form the guard ring opening portion B shown in FIG. 5, the interlayer insulating film 126 functions as an etch stop layer.

To this end, the interlayer insulating film 126 must be formed of a material having an etching selectivity with respect to the interlayer insulating films 136 and 140.

Figure 8G:
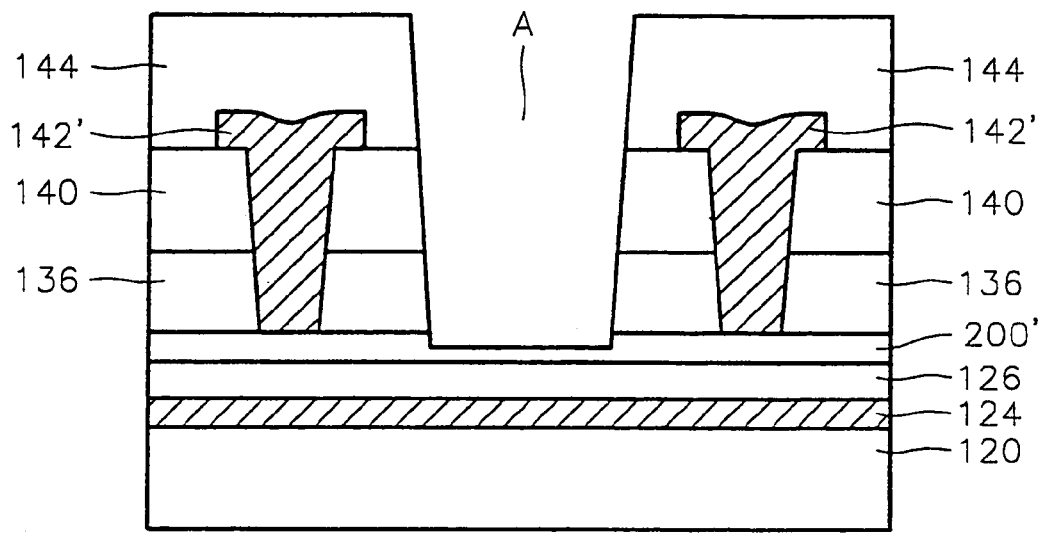
Figure 8H:
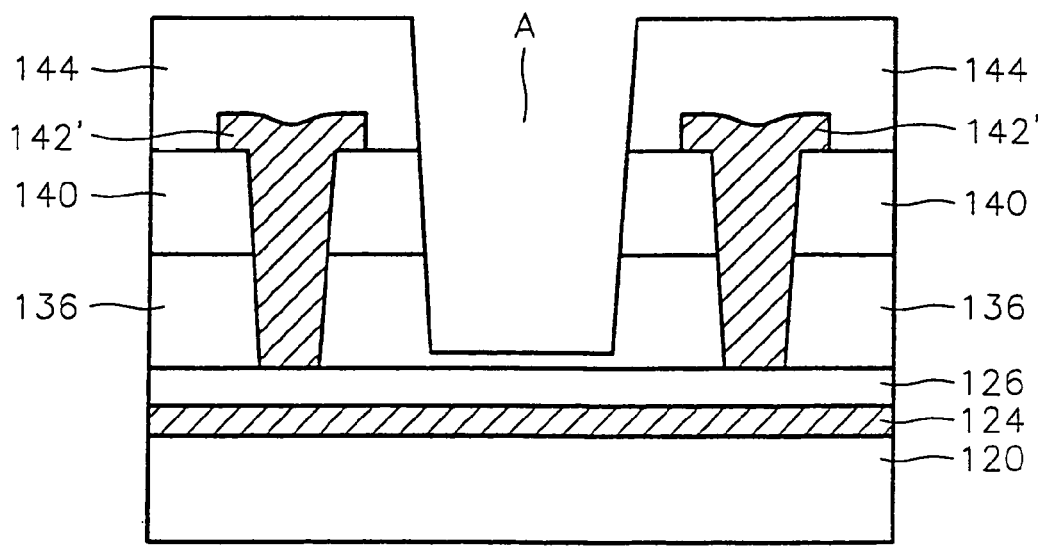

The fuse area of FIG. 8G is similar to the fuse area of FIG. 8F, but the moisture barrier layer 200' is as thick as that shown in FIG. 8C or FIG. 8E. The fuse area of FIG. 8H is similar to the fuse area of FIG. 8F, but the moisture barrier layer 200 is not formed.

Taking into account the modified examples described above, it can be seen that any one of 1) the etch stop layer 134', 2) the moisture barrier layer 200' and 3) the interlayer insulating film 126 may function as an etch stop layer. Accordingly, in this specification, the "etch stop layer" can be any one of the etch stop layer 134', the moisture barrier layer 200' and the interlayer insulating film 126, or a combination thereof.

Meanwhile, as described above, best cutting efficiency of a fuse line was achieved when the thickness of the interlayer insulating film remaining over the fuse line 124 in the fuse opening portion A was about 3000 Å. Other than the embodiments shown in FIGS. 8C, 8E and 8G, the fuse opening portion A is formed, after etching of the passivation layer 144 formed of silicon nitride, by timed-etching of the interlayer insulating films 140 and 136, each of which is formed a material chose from a silicon oxide family. However, it is difficult to accurately control the thickness of the interlayer insulating film remaining on the fuse line 124 using time-etching.

Figure 9A:
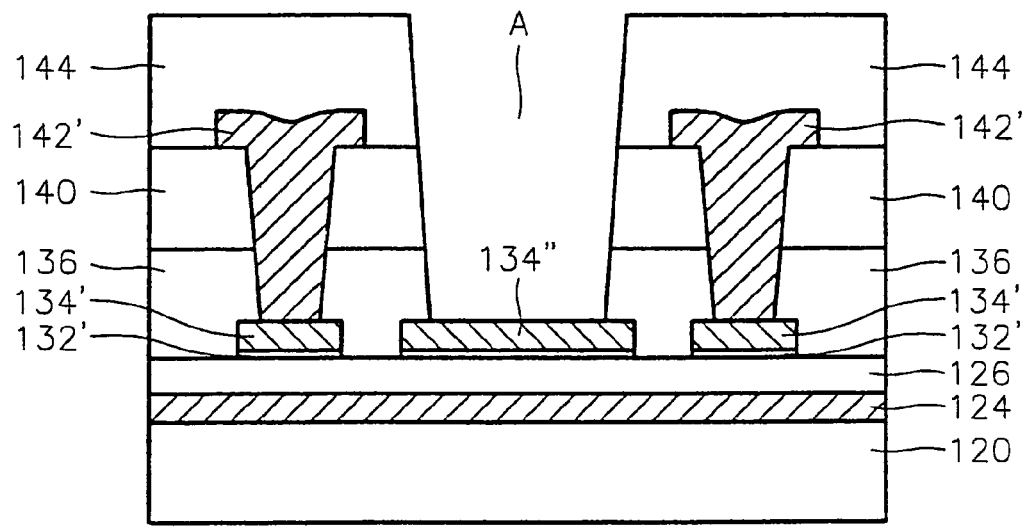

FIG. 9A shows another embodiment of the present invention to alleviate the above mentioned problem. The upper electrode layer described in FIG. 3 is patterned such that the upper electrode 134 is formed in the cell array area and etch stop layers 134' and 134" are also formed in regions where the guard ring 142' and the fuse opening portion A are to be formed, respectively, in the fuse area.

Then, the passivation layer 144 and the interlayer insulating films 140 and 136 are etched until the etch stop layer 134", which is formed in the lower portion of the fuse opening portion A, is exposed.

Figure 9B:
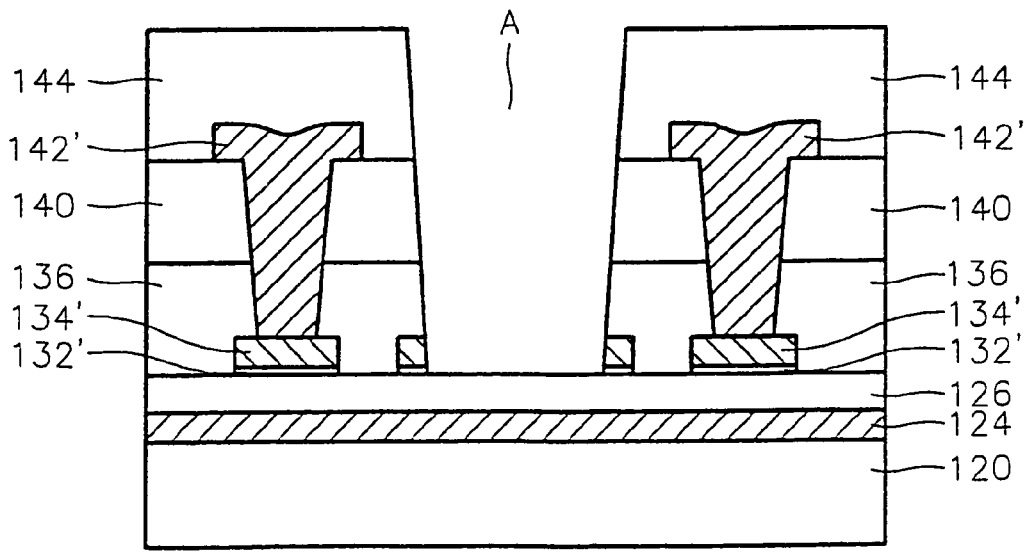

Subsequently, as shown in FIG. 9B, the exposed etch stop layer 134" in the lower portion of the fuse opening portion A is removed to complete the fuse opening portion A. The thickness of the interlayer insulating film 126 finally remaining on the fuse line 124 is adjusted to about 3000 Å. It is preferable that the etch stop layer 134' under the guard ring 142' is formed to be separated from the etch stop layer 134" in the lower portion of the fuse opening portion A. If the two etch stop layers 134' and 134" are connected, a metal from the guard ring 142' may diffuse into the etch stop layer 134', which is formed of, e.g., polysilicon. If this happens, etching of the etch stop layer 134" for completing the fuse opening portion A may not be performed properly.

Although not shown, it will be appreciated that the etch stop layer 134" may be formed in such a manner as described above and can be used as an etch stop layer during etching for formation of the fuse opening portion A as shown in FIGS. 8A through 8E. Accordingly, the thickness of an insulating film remaining on a fuse line can be more accurately controlled compared to conventional techniques.

Figure 10:
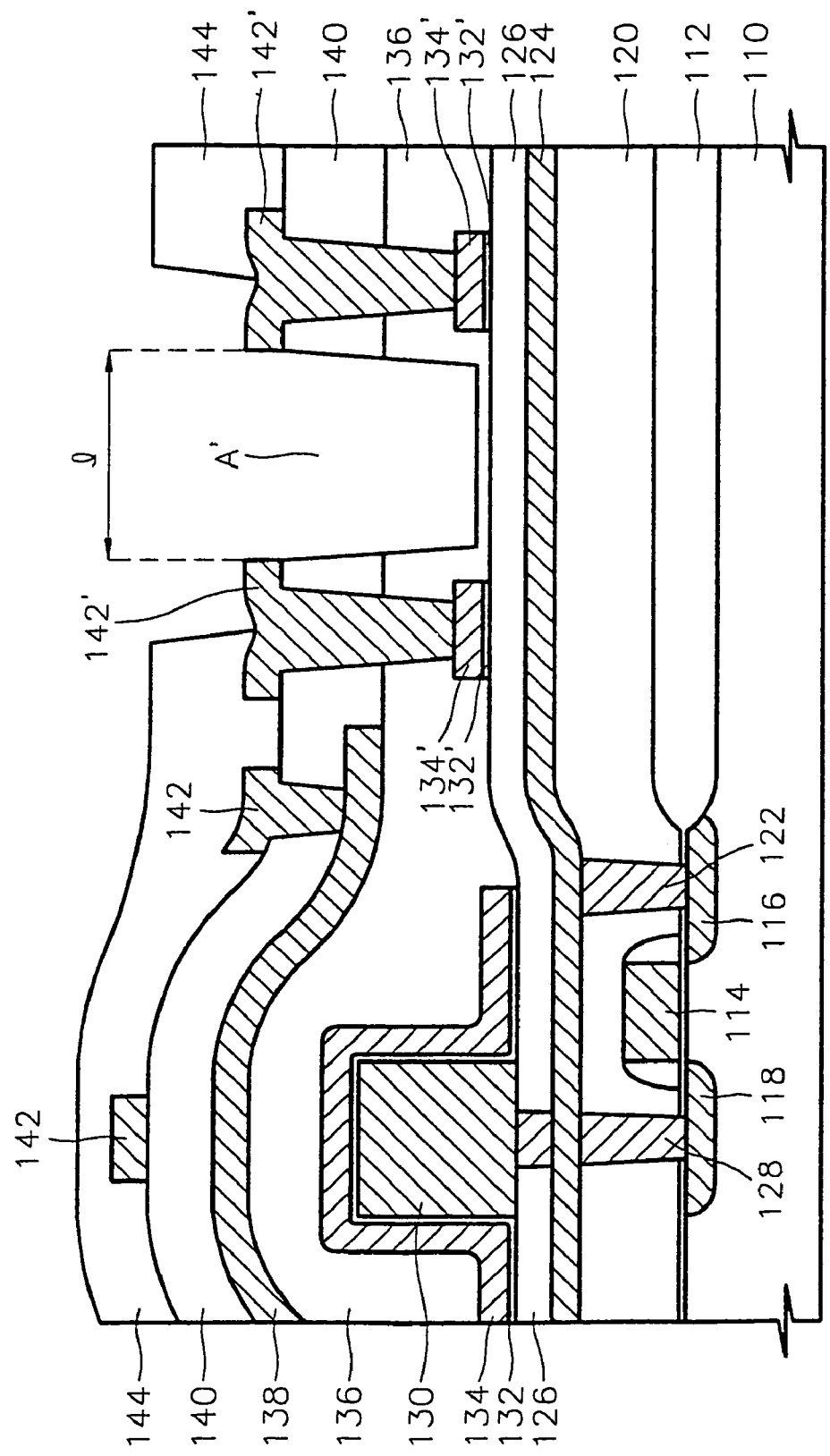

FIG. 10 is a sectional view of a fuse opening portion A' according to another embodiment of the present invention. The passivation layer 144 is etched to expose a portion of the guard ring 142'. Then, the interlayer insulating films 140 and 136 are etched self-aligned with the exposed guard ring 142' as a mask, thereby forming the fuse opening portion A'. Accordingly, an alignment margin increases, and an increase in an overall layout area due to formation of a guard ring can be reduced. In other words, the opening width l of the fuse opening portion A of FIG. 7 is the same as the opening width l of the fuse opening portion A' of FIG. 10. However, as shown in FIG. 10, an area represented by twice the width $l^1$ of FIG. 7, (i.e., width $2l_1$) can be eliminated, thereby decreasing the overall layout area. In addition, although not shown, it should be appreciated that the modified fuse opening portion A' as shown in FIG. 10 can be formed as shown in FIGS. 8A through 9B.

Figure 11:
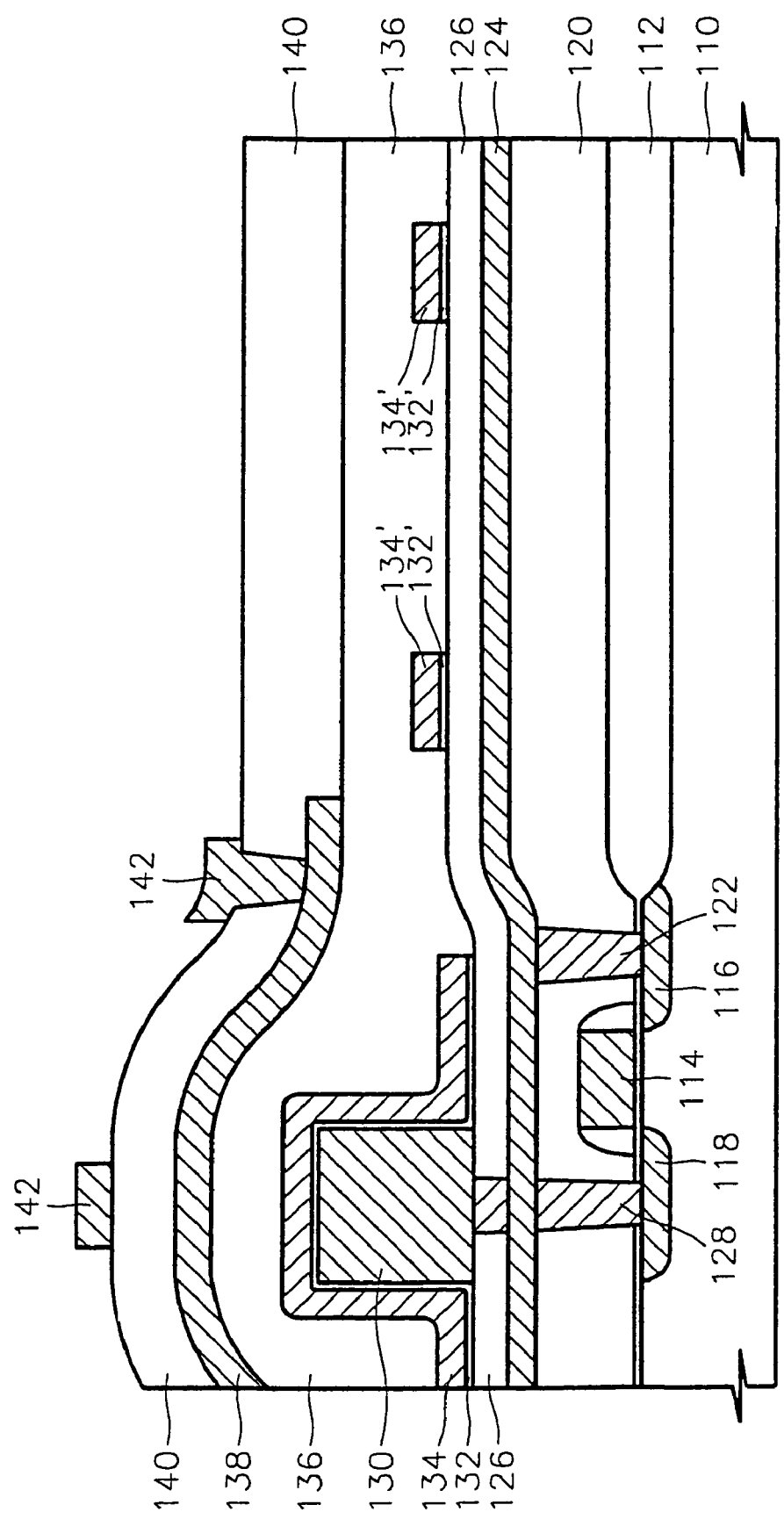
FIGS. 11 and 12 are sectional views of a semiconductor device for showing processes for forming a fuse area according to another embodiment of the present invention.
Figure 12:
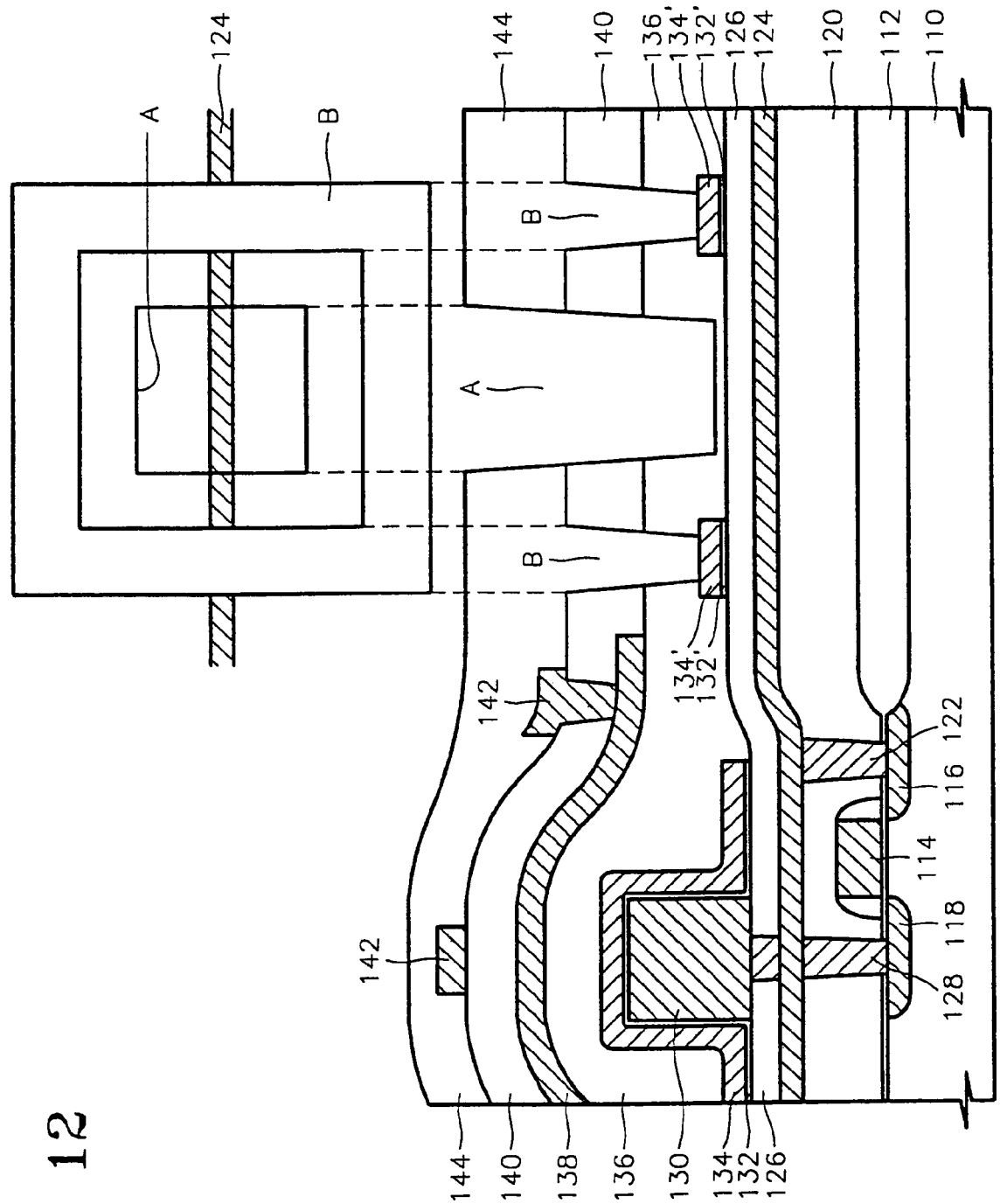

FIGS. 11 and 12 are sectional views of a semiconductor device for showing the processes of forming a fuse area according to another embodiment of the present invention. A DRAM device is used herein for illustration. The same processes as those in the embodiment described above are performed before a guard ring opening portion is formed. In other words, as shown in FIGS. 3 and 4, the capacitor is formed in the cell array area, and the etch stop layer 134' in the fuse area, the interlayer insulating film 136 and the lower interconnect wiring 138 are formed. Subsequently, as shown in FIG. 11, an uppermost interconnect wiring 142 is formed.

Next, as shown in FIG. 12, the interlayer insulating films 140 and 136 are etched to form a guard ring opening portion B. In the embodiment described above by reference to FIG. 5, the guard ring opening portion B is formed before the uppermost interconnect wiring 142 is formed and the guard ring opening portion B is filled with uppermost wiring metal. In the present embodiment, the guard ring opening portion B is formed after the uppermost interconnect wiring 142 is formed. Next, a material layer such as a silicon nitride film is deposited on the entire surface of the substrate including the uppermost interconnect wiring 142 and the guard ring opening portion B to form a guard ring and a passivation layer 144 simultaneously. Thereafter, a fuse opening portion A is formed in the same manner as those in the previous embodiment. Thus, the fuse opening portion A and the guard ring formed of the same material as the passivation layer 144 are formed to have a planar layout as shown on the upper right side of FIG. 7.

Further, as in the previous embodiment, a plurality of fuse opening portions A may be included in a single guard ring and a plurality of fuse lines 124 may pass through a single fuse opening portion A in the present embodiment. Moreover, it will be appreciated that the present embodiment can be modified as shown in FIGS. 8A through 9B. Methods of forming a fuse area through modification of the present embodiment are similar to those of the previous embodiment, and thus detailed description of them is omitted.

In the above description, there have been disclosed typical preferred embodiments of the invention. However, this invention should not be construed as being limited to these embodiments. For example, a DRAM device is used as an example in the above embodiments, but the structure of a fuse area and a manufacturing method thereof can be applied to static random access memory (SRAM) devices or other semiconductor devices with a fuse area.

As described above, according to the present invention, a guard ring is formed of the same material as that of the uppermost wiring metal of multi-level interconnect wirings or that of a passivation layer, thereby efficiently preventing moisture from permeating through the interface between interlayer insulating films. In addition, permeation of moisture through an interlayer insulating film under the guard ring can be prevented by a moisture barrier layer formed of a material having excellent resistance to moisture permeation, thereby obtaining reliable semiconductor devices.

According to one embodiment of the present invention, because the etch stop layer is used during formation of the fuse opening portion A, the thickness of an insulating film remaining on a fuse line can be more accurately controlled compared to conventional techniques. Thus, the cutting efficiency of a fuse can be improved.

Also, because a fuse opening portion can be formed by etching interlayer insulating films in self-alignment with the exposed guard ring as a mask (after a passivation layer is etched to expose a portion of a guard ring), an alignment margin and proportionally decreasing a layout area can be improved.

What is claimed is:

1. A method for forming a fuse area of a semiconductor memory device having a fuse opening portion for cutting a fuse line, a capacitor including an upper electrode, and a guard ring surrounding the fuse opening portion, the method comprising:

forming an etch stop layer over the fuse line and in a region, in which the guard ring is to be formed, concurrently with the upper electrode of the capacitor, the etch stop layer being formed of the same material as that of the upper electrode;

forming a moisture barrier layer over the etch stop layer and at least in regions in which the guard ring and the fuse opening portion are formed;

forming at least two levels of interlayer insulating films and at least two levels of interconnect wirings on the substrate including the etch stop layer, to form a multi-layer interlayer insulating layer structure in a fuse area and to form multi-level interconnect wirings, one of which is an uppermost interconnect wiring being formed in an area other than the fuse area, the interlayer insulating films alternating with the interconnect wirings;

forming a guard ring opening portion having a ring shape surrounding the fuse opening portion by etching the multi-layer interlayer insulating layer structure until the etch stop layer is exposed;

wherein said forming at least two levels of the interconnect wirings comprises depositing an uppermost wiring metal layer over the substrate including the guard ring opening portion to fill the guard ring opening portion with the uppermost wiring metal layer;

patterning the uppermost wiring metal layer to complete the multi-level interconnect wirings and to form the guard ring;

forming a passivation layer over the guard ring; and forming the fuse opening portion by etching the passivation layer and the multi-layer interlayer insulating layer structure.

2. The method of claim 1, wherein the passivation layer is formed directly over the guard ring.

3. A method for forming a fuse area of a semiconductor memory device having a fuse opening portion for cutting a fuse line, a capacitor including an upper electrode, and a guard ring surrounding the fuse opening portion, the method comprising:

forming an etch stop layer over the fuse line and in a region, in which the guard ring is to be formed, concurrently with the upper electrode of the capacitor, the etch stop layer being formed of the same material as that of the upper electrode;

forming a moisture barrier layer over the etch stop layer and at least in regions in which the guard ring and the fuse opening portion are formed;

forming at least two levels of interlayer insulating films and at least two levels of interconnect wirings on the substrate including the etch stop layer, to form a multi-layer interlayer insulating layer structure in a fuse area and to form multi-level interconnect wirings, one of which is an uppermost interconnect wiring being formed in an area other than the fuse area, the interlayer insulating films alternating with the interconnect wirings; and forming a guard ring opening portion surrounding the fuse opening portion by etching the multi-layer insulating layer structure until the etch stop layer is exposed, wherein said forming the at least two levels of the interconnect wirings comprises:

depositing an uppermost wiring metal layer over the substrate including the guard ring opening portion to fill the guard ring opening portion with the uppermost wiring metal layer; and patterning the uppermost wiring metal layer to complete the multi-level interconnect wirings and to form the guard ring.

4. The method of claim 3, wherein the guard ring is formed of the same material as that of the uppermost wiring metal layer, and the guard ring is formed concurrently with the uppermost wiring metal layer.

5. The method of claim 3, wherein the guard ring is opening portion is ring-shaped.

6. The method of claim 3, wherein more than one fuse opening portion is within a perimeter defined by the guard ring.

7. The method of claim 3, wherein more than one fuse line crosses an area within a perimeter defined by the guard ring.

8. A method for forming a fuse area of a semiconductor device having multi-level interconnect wirings including a lowermost wiring and an uppermost wiring, a fuse opening portion formed through a multi-layer insulating layer structure for cutting a fuse line disposed over a semiconductor substrate, and a guard ring surrounding the fuse opening portion, the method comprising:

forming an etch stop layer pattern over the fuse line and at least in a region where the guard ring is to be formed;

forming a moisture barrier layer over the fuse line and at least in regions in which the guard ring and the fuse opening portion are formed;

forming the multi-layer interlayer insulating layer structure over the semiconductor substrate including the etch stop layer pattern, the multi-level insulating layer structure including a lowermost insulating layer and an uppermost insulating layer;

etching portion of the multi-layer insulating layer structure until to form a guard ring opening portion surrounding the fuse opening portion, the guard ring opening portion extending through the uppermost insulating layer and the lowermost insulating of the multi-layer insulating layer structure; and forming the guard ring by filling the guard ring opening portion with a predetermined material, wherein the guard ring opening portion extends substantially vertically in a direction to the upper surface of the multi-layer insulating layer structure, and wherein a portion of the etch stop layer pattern is below a bottom surface of the guard ring.

9. The method of claim 8, wherein the moisture barrier layer is a silicon nitride film.

10. The method of claim 8, wherein the moisture barrier layer is formed over the etch stop layer pattern.

11. The method of claim 10, wherein etching a portion of the multi-layer insulating layer structure is performed until the etch stop layer pattern is exposed such that the guard ring extends through the moisture barrier layer and contacts the etch stop layer pattern.

12. The method of claim 8, wherein the moisture barrier layer is formed under the etch stop layer pattern and extends under the fuse opening portion.

13. The method of claim 8, wherein a bottom surface of the guard ring is disposed on a top surface of the moisture barrier layer.

14. The method of claim 13, wherein the moisture barrier layer is formed to a thickness greater than 5000 angstroms.

15. The method of claim 8, further comprising forming an interlayer insulating film pattern disposed under the etch stop layer pattern.

16. The method of claim 15, wherein a sidewall of the etch stop layer and a sidewall of the interlayer insulating film pattern form a common sidewall and the moisture barrier layer is conformally formed on the common sidewall.

17. The method of claim 16, wherein the moisture barrier layer is formed to a thickness greater than 5000 angstroms.

18. A method for forming a fuse area of a semiconductor device having multi-level interconnect wirings including a lowermost wiring and an uppermost wiring, a fuse opening portion formed through a multi-layer interlayer insulating layer structure for cutting a fuse line disposed over a semiconductor substrate, and a guard ring surrounding the fuse opening portion, the method comprising:

forming an interlayer insulating layer over the fuse line;
  forming a moisture barrier layer over the interlayer insulating layer and at least in regions in which the guard ring and the fuse opening portion are formed;
  forming the multi-layer interlayer insulating layer structure over the moisture barrier layer, the multi-level interlayer insulating layer structure including a lowermost insulating layer and an uppermost insulating layer, wherein the uppermost insulating layer is formed on the lowermost wiring and the uppermost wiring is formed on the uppermost insulating layer;
  after forming the multi-layer interlayer insulating layer, etching the uppermost insulating layer and the lowermost insulating layer so as to form a guard ring opening portion surrounding the fuse opening portion, the guard ring opening portion extending through the uppermost insulating layer and the lowermost insulating layer; and
  forming the guard ring by filling the guard ring opening portion with a predetermined material,
  wherein the guard ring opening portion extends substantially vertically in a direction from the moisture barrier layer to the upper surface of the multi-layer insulating layer structure.

19. The method of claim 18, wherein a bottom surface of the guard ring is disposed on the interlayer insulating layer.

20. The method of claim 18, wherein a bottom surface of the guard ring is disposed on a top surface of the moisture barrier layer.

21. The method of claim 1, wherein the moisture barrier layer is overlapped by the fuse opening portion.

22. The method of claim 1, wherein a portion of the moisture barrier layer is closer to the fuse line than the etch stop layer, said portion being laterally between the fuse opening portion and the etch stop layer.

23. The method of claim 8, wherein the moisture barrier layer is an undoped silicate glass (USG) film.

24. The method of claim 8, wherein the moisture barrier layer is a stacked film of a silicon oxide film and a silicon nitride film.

* * * * *

UNITED STATES PATENT AND TRADEMARK OFFICE
CERTIFICATE OF CORRECTION

PATENT NO.        : 7,517,762 B2                                          Page 1 of 1
APPLICATION NO.   : 11/139906
DATED             : April 14, 2009
INVENTOR(S)       : Byung-yoon Kim et al.

It is certified that error appears in the above-identified patent and that said Letters Patent is hereby corrected as shown below:

Column 8, line 4, the word "1$^1$" should read -- 11 --;
Column 10, line 6, the word "insulating" should read -- interlayer insulating --;
Column 10, line 8, the words "wherein said" should read -- wherein --;
Column 10, line 21, the words "ring is" should read -- ring --;
Column 10, line 42, the word "multi-level" should read -- multi-layer --;
Column 10, line 45, the word "etching" should read -- etching a --;
Column 10, line 46, the words "until to" should read -- until --;
Column 10, line 49, the word "insulating" should read -- insulating layer --;
Column 11, line 30, the word "multi-level" should read -- multi-layer --.

Signed and Sealed this

Fifteenth Day of September, 2009

David J. Kappos
*Director of the United States Patent and Trademark Office*